(12) United States Patent
Hisaeda et al.

(10) Patent No.: US 8,293,142 B2
(45) Date of Patent: Oct. 23, 2012

(54) COMPOSITION CONTAINING FINE SILVER PARTICLES, PRODUCTION METHOD THEREOF, METHOD FOR PRODUCING FINE SILVER PARTICLES, AND PASTE HAVING FINE SILVER PARTICLES

(75) Inventors: Yutaka Hisaeda, Okayama (JP); Toshihiko Ueyama, Okayama (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 13/187,141

(22) Filed: Jul. 20, 2011

(65) Prior Publication Data

US 2011/0278508 A1 Nov. 17, 2011

Related U.S. Application Data

(62) Division of application No. 12/739,239, filed as application No. PCT/JP2008/069234 on Oct. 23, 2008.

(30) Foreign Application Priority Data

Oct. 24, 2007 (JP) ................................ 2007-276099

(51) Int. Cl.
*H01B 1/22* (2006.01)
(52) U.S. Cl. ..................... 252/512; 252/514; 252/518.1; 252/519.3; 252/520.3; 977/773; 977/775; 977/777; 977/788
(58) Field of Classification Search .................. 252/500, 252/512, 514, 518.1, 519.3, 520.3; 977/773, 977/775, 777, 788
See application file for complete search history.

(56) References Cited

U.S. PATENT DOCUMENTS

| 4,463,030 | A | * | 7/1984 | Deffeyes et al. | 427/216 |
|---|---|---|---|---|---|
| 6,190,578 | B1 | * | 2/2001 | Yokoyama et al. | 252/512 |
| 2003/0201427 | A1 | | 10/2003 | Hori et al. | |
| 2005/0239947 | A1 | * | 10/2005 | Greenhill | 524/495 |
| 2005/0279970 | A1 | | 12/2005 | Ogi et al. | |
| 2006/0145125 | A1 | * | 7/2006 | Kuwajima et al. | 252/500 |
| 2007/0134491 | A1 | | 6/2007 | Atsuki et al. | |
| 2007/0144305 | A1 | | 6/2007 | Jablonski et al. | |

(Continued)

FOREIGN PATENT DOCUMENTS

CN 1849260 10/2006

(Continued)

OTHER PUBLICATIONS

U.S. Appl. No. 13/187,159, filed Jul. 20, 2011 to Hisaeda et al.

(Continued)

*Primary Examiner* — Mark Kopec
*Assistant Examiner* — Tri V Nguyen
(74) *Attorney, Agent, or Firm* — Greenblum & Bernstein, P.L.C.

(57) ABSTRACT

A composition containing fine silver particles which have a uniform particle size, can form a fine drawing pattern, and have a small environmental impact, a method for producing that composition, a method for producing fine silver particles, and a paste having fine silver particles are provided. The fine silver particles are produced by carrying out a fluid preparation step of preparing a reduction fluid, a silver reaction step, and a filtration/washing step. The reaction step is carried out by adding an aqueous silver nitrate fluid to a reduction fluid whose temperature has been increased to a range between 40 and 80° C. The aqueous silver nitrate fluid is added at a stretch. The composition containing fine silver particles is produced by dispersing the composition containing the fine silver particles in a polar fluid.

5 Claims, 8 Drawing Sheets

(a)

(b)

U.S. PATENT DOCUMENTS

| | | |
|---|---|---|
| 2007/0163678 A1 | 7/2007 | Kim |
| 2008/0089836 A1 | 4/2008 | Hainfeld |
| 2008/0207934 A1 | 8/2008 | Kim et al. |
| 2009/0236404 A1* | 9/2009 | Yamakawa et al. ........ 228/123.1 |
| 2009/0258202 A1 | 10/2009 | Sakaguchi et al. |
| 2010/0243967 A1 | 9/2010 | Hisaeda et al. |

FOREIGN PATENT DOCUMENTS

| | | |
|---|---|---|
| EP | 1666408 | 6/2006 |
| GB | 2278117 A * | 11/1994 |
| JP | 54-121270 | 9/1979 |
| JP | 07-157814 | 6/1995 |
| JP | 11-319538 | 11/1999 |
| JP | 2001-35255 | 2/2001 |
| JP | 2003-253311 | 9/2003 |
| JP | 2005-164875 | 6/2005 |
| JP | 2006-89768 | 4/2006 |
| JP | 2007-146271 | 6/2007 |
| JP | 2007-246831 | 9/2007 |
| WO | WO2004068506 A1 * | 8/2004 |
| WO | 2005/023702 | 3/2005 |
| WO | WO2007034833 A1 * | 3/2007 |
| WO | 2007/043664 | 4/2007 |
| WO | WO2007043664 A1 * | 4/2007 |

OTHER PUBLICATIONS

Trail Decision for invalidation of parts of claims in counterpart Japanese Patent No. 4344001, mailed Mar. 15, 2011 along with English language translation.

Supplementary European Search Report for counterpart EP08843155, mailed Jul. 8, 2011.

Itoh et al., Ultrafine Particle and Cluster Symposium, 5th Conference, Collection of Lecture Papers (Jun. 2001), "Stabilized Shell Structure of Nanoscale Silver Particles Dispersed in Organic Solvent" accompanied by English translation of marked portions.

International Search Report, International Preliminary Report on Patentability and Written Opinion that issued with respect to PCT/JP2008/069234 (in Japanese and English Translation).

Japanese Office Action (Decision of Patent Grant) that issued with respect to patent family member Japanese Patent Application No. 2008-274653, along with an English language translation, mailed Jun. 30, 2009.

Abe et al., "Two-dimensional array of silver nanoparticles". Thin Solid Films. vol. 327-329, pp. 524-527, 1998.

* cited by examiner (a)

(b)

(a)

(b)

(a)

(b)

(a)

(b)

(a)

(b)

(a)

(b)

(a)

(b)

COMPOSITION CONTAINING FINE SILVER PARTICLES, PRODUCTION METHOD THEREOF, METHOD FOR PRODUCING FINE SILVER PARTICLES, AND PASTE HAVING FINE SILVER PARTICLES

RELATED APPLICATIONS

The present application is a divisional of U.S. patent application Ser. No. 12/739,239, which is expressly incorporated herein by reference in its entirety, which is a National Stage application of PCT Application No. PCT/JP2008/069234, filed Oct. 23, 2008, which claims priority to Japanese Application No. 2007/276099, filed Oct. 24, 2007.

TECHNICAL FIELD

The present invention relates to a method for producing fine silver particles which have diameters a less than 100 nm, a composition containing of those fine silver particles, a method for producing such composition, and a paste having fine silver particles.

BACKGROUND ART

Materials which diameters are less than 100 nm (it paraphrases it in this description like this from now on; "nano-sized substance") are known to have a large specific surface area and to exhibit different characteristics from those of substances which are generally known.

In particular, metals are found to exhibit phenomena, because of reactivity increases at the surface of the fine particle, melting point is decreased.

Because of their unique characteristics, nano-sized substance is promising at the field of electronic devices; the production of equipments to small size, and the provision at low cost.

Downsizing of electronic devices are mainly blessed with improvements in the degree of integration of semiconductors.

Furthermore, higher integration of the pattern connecting between the semiconductors on a printed substrate is also necessary for the downsizing of electronic devices.

It is desirable for such a highly integrated pattern to have a narrow line width and a high electrical conductivity.

It was able to overcome such demands; they were able to use some methods, for example, plating, vapor deposition and sputtering.

However, we need to prepare big apparatus when we'll use those methods. And we have to renew when we need to more fine patterns, so they aren't suitable for drawing of finer lines.

Thus, if we can get apparatus which has compact and high efficiency, it's very comfortable to draw of fine metallic lines.

Examples of methods for forming a drawing pattern which satisfy these requirements include methods employing a printing technique, such as inkjet printing and screen printing.

For example, to form a drawing pattern on the substrate by a printing technique, a conductive paste in which a fine metal powder is dispersed in a binder is used.

However, problems with this method are that the precision of the pattern formation is low, and that the electrical conductivity of the produced pattern is lower than that of the original metal.

Conventional conductive pastes, which dispersed in an organic resin binder, contains of metal particles which average diameter is from several tens to hundreds microns. Thus, it is difficult to form fine line more than a diameter of average particle size.

Furthermore, the printed pattern has a structure in which the metal powder contacts each other at points. Consequently, the electrical conductivity is substantially worse than that of a sheet shape of the pure metal.

One way to resolve such problems of a conductive film formed by printing is to use the above-described nano-sized metal particles.

If such fine metal particles are used, a high-precision drawing pattern can be formed at a higher density than conventional paste. Consequently, we can get increasing the number of particles per unit volume; so electrical conductivity can also be expected to improve to closer to that of a sheet shape of the pure metal.

In addition, because of increases of the fine particle reactivity, melting point is decreased.

Because of those phenomena, we can get a sheet of metallic at lower sintering temperature than conventional.

From this perspective, various methods have been investigated which was using nano-sized metal particles, and several proposals have already been made.

As methods for producing nano-sized metal particles, gas-phase methods and fluid-phase methods are mainly known.

For example, Patent Document 1 describes that a dispersion of independent ultra fine silver particles can be obtained by producing ultra fine particles of silver by a gas-phase method in vacuo and then mixing these particles with an organic solvent. In this dispersion, the surface of the ultra fine particles is covered with the organic solvent, so that each of the particles is independently dispersed.

Patent Document 2 describes ultra fine particles obtained by a fluid-phase method.

In this technique, metal fine particles formed by reduction of metal ions in an aqueous phase undergo a phase transfer from the aqueous phase to a more stable organic solvent phase. More specifically, a small amount of a protective colloid is made to be present in the organic solvent in advance so that the metal fine particles undergo a phase transfer from the aqueous phase to the stable organic solvent layer, and are formed as stable colloid particles. This allows the metal particles to be obtained in a high concentration in the organic solvent phase.

Patent Document 3 also describes a production method in the fluid phase.

Patent Document 3 describes that during the production of silver nano-particles by reducing a silver salt in a solvent, rather than the typically used silver nitrate, a silver halide (especially silver chloride or silver bromide), which is insoluble as a silver salt, is used. Furthermore, in the method described in Patent Document 3, the reduction is carried out in the presence of a protection agent formed from a compound which is dissolved in the solvent and which can be coordinated with silver.

In this method, it is described that a mono-dispersion can be obtained in which silver nano-particles are coated/protected by the protection agent and dispersed in the solvent.

It is also described that a polar solvent is used as the solvent, and a thiol, such as thiocholine bromide, is preferred as the protection agent.

Patent Document 4 also describes a method for obtaining nano-order fine silver particles which are mono-dispersed in a polar solvent using a fluid-phase method.

This document describes that silver nitrate is used as the starting material for obtaining the fine particles of silver, and that heptanoic acid is used as the protection agent.

[Patent Document 1] Japanese Patent Application Laid-Open No. 2001-35255
[Patent Document 2] Japanese Patent Application Laid-Open No. Hei. 11-319538
[Patent Document 3] Japanese Patent Application Laid-Open No. 2003-253311
[Patent Document 4] US 2007/0144305 A1

DISCLOSURE OF THE INVENTION

Problems to be Solved by the Invention

A conventional conductive paste contains a resin as a binder for fastening metal fine particles after formation of a pattern by printing.

To include the resin, an organic solvent is used as a solvent.

However, organic solvents have some problems, such as the ventilation is required during operation, and the combustion treatment of solvent is necessary during sintering, and the waste fluids producing by washing cannot be disposed of into the environment. Because of these problems, the organic solvent has drawbacks in terms of working efficiency, safety, and impact on the environment.

As a method for producing metal fine particles, from the perspective of industrial mass-productivity, a fluid-phase method is appropriate.

The method of these fluid-phase, it is preferred that the metal fine particles can be synthesized in a polar solvent, particularly water. And it is more preferred that the synthesized metal fine particles can be easily collection and are stably present even in a dry state. And moreover it is preferred that the obtained dry state particles can be easily redispersed by the polar solvent.

Although Patent Document 3 or Patent Document 4 can produce such metal fine particles, the obtained fine particles often have an unstable particle size depending on the production conditions.

Furthermore, the dry state metal fine particles obtained by the synthesis described in Patent Document 4 require further improvement in terms of their redispersibility in the polar solvent.

The present invention was devised in view of such problems in the conventional art. It is necessary of solving by the present invention to provide are these, a first purpose is the present invention is a method of producing fine silver particles which have a uniform particle size, and second purpose of the invention is a method of producing composition of fine silver particles and the composition thereof, and third purpose of invention is getting of a paste of fine silver particles. And these solving methods need with small environmental impact.

Means for Solving the Problems

For a result of extensive research to achieve the above-described objects, inventors discovered that the objects could be achieved by synthesizing silver particles in a fluid phase, and then dispersing the obtained particles by a polar solvent, thereby arriving at the present invention.

More specifically, a composition containing fine silver particles according to the present invention is characterized by including silver particles which was attached to a linear fatty acid having 6 or less carbon atoms.

Furthermore, a method for producing fine silver particles by present invention is including these characteristic steps; a step of preparing a reduction fluid containing water, ammonia water, hexanoic acid, and an aqueous fluid of hydrazine hydrate; a step of reduction, an aqueous silver nitrate fluid adding into the reduction fluid; and a step of filtering a product of the reaction and then washing the product with water. And a method for producing composition of fine silver particles according to the present invention further includes this step, dispersing the fine silver particles, which produced by the above-described method, into a polar solvent.

In addition, a paste according to the present invention is characterized by having the fine silver particles included in the composition containing fine silver particles.

Effects of the Invention

By using a linear fatty acid having six or less carbon atoms as a protection agent, the present invention can provide a method for producing fine silver particles which can exist even into a polar solvent including water, and a composition containing fine silver particles, and a producing method for such composition, and a paste having fine silver particles.

BEST MODE FOR CARRYING OUT THE INVENTION

Figure 1:
FIG. 1 shows SEM photographs of an example according to the present invention.
Figure 1:
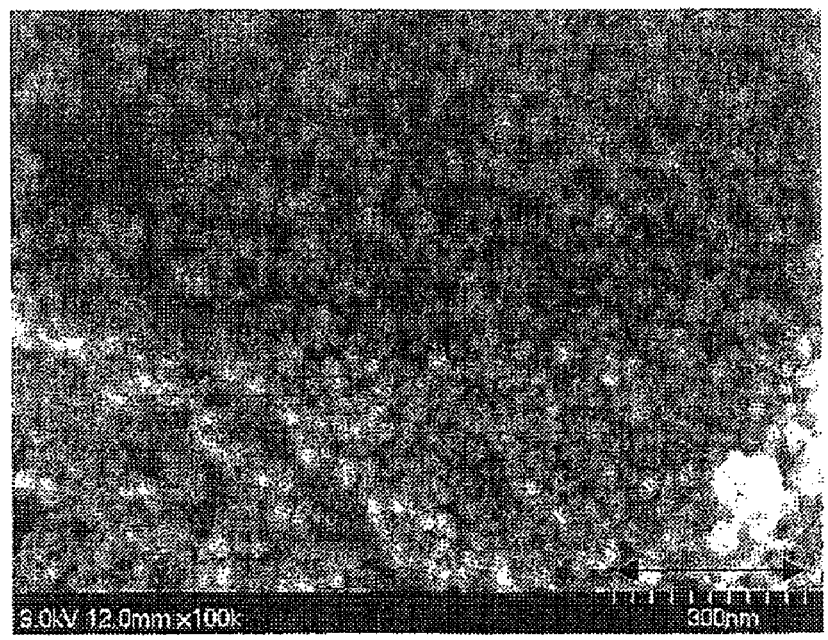

In the description of the present invention, the term "agglomerated" means to a state in which a plurality of particles are agglomerated with each of the particles present as individual particles, and each of the particles can again be dissociated by a suitable dispersion treatment. Furthermore, the term "aggregated" means to a state in which a plurality of particles are fused together to form a single rough particle which cannot again be dissociated even if subjected to a dispersion treatment.

The composition of present invention is fine silver particle covered in a fatty acid having six or less carbon atoms. Due to this configuration, the fine silver particles in agglomerate state exist stably under aridity. Furthermore, this agglomeration dissociates into individual particles, they can exist stably in the polar solvent.

The linear fatty acid having six or less carbon atoms functions as a protection agent.

This protection agent has a function which exists with stability, because of covering the silver particles, or in other words, by allowing to adhere to the surface of the silver particles, to avoid fusing with each other.

In the present invention, a comparatively linear fatty acid with a little numbers of carbons is preferred.

Specifically, it is preferred to use hexanoic acid.

In addition, the composition containing fine silver particles of this invention may be having polar solvent. In this case, the fine silver particles can be dispersed into this polar solvent. Water or an organic solvent having a polar group can be used as this polar solvent.

Specific examples of the polar solvent include water, alcohol, polyol, glycol ether, 1-methylpyrrolidinone, pyridine, terpineol, butyl carbitol, butyl carbitol acetate, texanol, phenoxypropanol and the like.

Next, the method for producing the fine silver particles of the present invention will be described.

A method for producing fine silver particles by present invention is including these characteristic steps: a step of making a fluid of raw material and a fluid of reduction; a step of increasing fluids temperature; a step of reaction, raw material fluid adding into the reduction fluid; a ripeness step of growing the metal particles (especially silver particles) in the fluid; a filtration/washing step of repeatedly filtering and washing to remove superfluous organic substances; and a drying step of removing moisture from the fluid by drying.

The filtration step will be described in more detail. In many conventional fine silver particle reactions, the fine silver particles float into the reaction fluid and cannot be easily separating because the fine silver particles completely disperse by primary particles into the reaction fluid after the reaction.

Such fine silver particles are usually separated by making them sediment in the fluid by centrifugation.

However, according to the production method of invention, nano-sized primary fine particles form a loose agglomeration. So agglomeration sink in the reaction fluid naturally, the particles can be separated easily.

So the particles can be separated easily with filtration, without centrifugation, using a filter cloth and so on.

This dramatically contributes for increasing of the mass-productivity and in reducing costs.

In the present invention, a step of making a fluid of reduction, a step of reaction of silver, and the filtration/washing step are carried out as follows.

Specifically, the reduction fluid to be used in a step of making a fluid of reduction includes water, ammonia water, hexanoic acid, and hydrazine hydrate.

In the silver reaction step, an aqueous silver nitrate fluid is added to this reduction fluid and a reaction is carried out.

In the filtration/washing step, the product obtained in the reaction step is separated by filtration, and then washed with water.

The ammonia water included in the reduction fluid is added as a stabilizing agent to dissolve the acid by the water.

In the silver reaction step, the reaction is carried out by increasing the temperature to a range preferably between 40° C. and 80° C. in the reaction vessel.

It is more preferred for the reaction, the temperature of the aqueous silver nitrate fluid, as same temperature as the fluid of reaction vessel, is prepared.

If the temperature in the reaction vessel is not in the above-described range, the following problems may occur.

At less than 40° C., the tendency of supersaturation of metal in the reaction fluid increases so nucleation is more promoted, so a proportion of the fine particles are vainly increased.

At more than 80° C., although nucleation is suppressed, particle abnormal growth and particle aggregation tend to be promoted.

Furthermore, at the silver reaction step, the aqueous silver nitrate fluid is added preferably at a stretch for the homogeneous reaction in the fluid.

If the aqueous silver nitrate fluid is not added at a stretch, the fluid becomes a heterogeneous system, and nucleation and particle agglomeration occur all at once. This may cause to generate non-uniform silver particles having a large particle distribution.

Therefore, the expression "added at a stretch" is not especially limiting when reaction factors, such as the concentration of reduction agent or protection agent, or pH or temperature of reaction fluid, do not essentially change during the period of adding the aqueous silver nitrate fluid.

The hydrazine hydrate can be changing into any reducing agent, when it can reduce metal. Hydrazine hydrate can be used with another reducing agent. The reducing agent except of the hydrazine hydrates are illustrated hydrazine, an alkali borohydride ($NaBH_4$), lithium aluminum hydride (LAIN, ascorbic acid, a primary amine, a secondary amine, a tertiary amine and so on.

The specific surface area of fine silver particle measured by the BET method of this invention is 5 to 20 $m^2/g$ The surface area of the particles has influence over viscosity of fluid dispersions.

Therefore, the viscosity of fluid dispersions can be controlled by adjusting the surface area of the fine silver particles.

And the surface area can also be controlled by appropriately adjusting the temperature in reaction fluid, or the amount of the reducing agent or the protection agent.

If BET value is 5 $m^2/g$ or less, that means, the proportion of fine particles may have decreased, or coarse particles may be increased caused by aggregation. This means that it is difficult to control the BET value while maintaining the particle size.

If such particles are used, the trouble, such as clogging of the nozzle aperture, and the incidence of unsuitable particles for fine interconnecting, may be caused according to printing methods.

When the coarse particles are extremely increased; the ratio of particles collected by filter-paper during the below-describe fluid flow evaluation may increase.

Furthermore, although the upper limit of BET value is 20 $m^2/g$, this is current limit upper value of the production by this method.

The point of view about this invention is the fine particles can be produced stably in a large scale or mass production. In the sense of that viewpoint, the value of BET is preferred range is 7-20 $m^2/g$, more preferred range is 10-20 $m^2/g$.

Measurement of the specific surface area by the BET method, after performing a pre-treatment in an $N_2$ atmosphere at 25° C. with the flowing rate of 45 cc/min, was carried out using 4S-U2 manufactured by Yuasa Ionics Inc., or equivalent can use for measurement.

The TAP density is preferred range is 0.5 to 5.0 $g/cm^3$.

If the TAP density is lower than 0.5 $g/cm^3$, the compaction of the particles in the film is insufficient and the film density after sintering is reduced, so they may cause resistance to deteriorate.

The TAP density is more preferably 1.0 to 4.5 $g/cm^3$, and even more preferably 1.5 to 4.0 $g/cm^3$ Measurement of the TAP density of this invention was carried out using a measurement method described in Japanese Patent Application Laid-Open No. 2007-263860.

Next, the silver content will be described.

The composition containing fine silver particles of the present invention may also be used in applications such as interconnection formation in the electronic materials field and the like.

For use of interconnection formation application and the like, the composition containing fine silver particles of the present application is printed on a substrate by an arbitrary printing method, and the composition sinter for changing to the state of silver.

At the time, if the amount of protection agent covering the silver is large, the amount of protection agent which evaporates in the sintering step increases. Consequently, the ratio of contraction volume of the silver interconnection before and after the sintering is increased which is not desirable in terms of substrate production.

This is because a defect such as interconnection scaling is occurred.

Thus, the silver content of the composition containing fine silver particles is as close as possible to 100 mass %, and preferably 95 mass % or more.

If the silver content is less than 95 mass %, the amount of protection agent covering the silver particles is too large, and that means causing the volume contraction ratio to increase.

In the present invention, a more preferred range is 96 mass % or more, and more preferred is 96.5 mass % or more.

Measurement of the silver content was carried out by placing a composition containing dry fine silver particles in an ash tray (square type, 50×30×10) to thickness of 1 to 2 mm, sintering silver particle at the ash tray in muffle furnace (F0310, manufactured by Yamato Scientific Co., Ltd.), and measured the weight after and before sintering, and calculate the silver content of the particle.

Furthermore, the sintering conditions were that, in the atmosphere, the temperature was increased from 25° C. to 700° C. at a rate of increase of 10° C./min, and then the ash tray was allowed to naturally cool to room temperature.

The crystallite size of the fine silver particles in the present invention is in the range of 1 to 30 nm.

If the crystallite size is less than 1 nm, the fine silver particles essentially may not be present due to progress of sintering. If the crystallite size is more than 30 nm, ease of sintering may be, worse.

So a preferred range of crystalline size is 5 to 20 nm, and a more preferred range is 9 to 15 nm.

The crystallite size measurement in the present invention was carried out by a RINT 2000 manufactured by Rigaku Corporation in crystal face of (111). And the condition of measurement were these: a measurement range is 40 to 60° at 2, and multiplied times of measurement is six, and X-ray source was Co, and X-ray tube voltage was 40 kV, and X-ray tube current was 30 mA.

The crystallite size was calculated using the Scherrer equation described by the following equation (1). And the "half value width" β which is necessary of the calculation of equation, was worked out by above-mentioned measurement, $$Dhkl=(K\cdot\lambda)/(\beta\cdot\cos\delta) \quad (1)$$

Here, the respective variables are as follows.
D: Crystallite size (nm)
A: Measurement X-ray wavelength (nm)
λ: Broadening in the diffraction width due to the crystallite
β: Bragg angle of the diffraction angle
K: Scherrer constant
   In the above equation (1), the measurement X-ray wavelength λ is 1.79, and the Scherrer constant K is 0.94.

The characteristic of this invention is having a dispersion step to polar solvent of the fine silver particles composition after above-described method which is composed by doing sequentially; a step of making reaction fluid, a step of reacting of silver, a step of filtration/washing, and a step of drying.

Here, the term "dispersion" refers to a state where the fine particles are stably present in the polar solvent. Because of leaving at rest, some of the fine particles may be settled, but they are allowable.

By performing such a step, the fine silver particles in agglomerate state exist stably under aridity. However, this agglomeration dissociates into individual particles, they can exist stably in the polar solvent including water by an appropriate redispersion treatment.

The term "agglomeration size", which refers to the particle size on the agglomerated state, will be described.

In the description of the present invention, Coulter average size is used for the agglomeration size.

The composition containing fine silver particles of present invention can separate by filtration in virtue of characteristic of agglomerating during the reaction.

Therefore, after the filtration/washing step and in the dry condition after the drying step, the silver particles are present in an agglomerated state.

In spite of such a dry condition of fine particles, can be redispersed into the solvent when used for a dispersion or a paste.

To quantify this phenomenon, the dispersed particle size after redispersion in the solvent was measured by the Coulter method which is wet type laser diffraction.

That is to say, the average particle size measured by the Coulter method means the size of primary particle which had been dried, and is redispersed in the solvent.

The measurement method for average particle size of the Coulter will be described.

The SDBS fluid was prepared by mixing SDBS (Sodium dodecyl benzene sulfonate) with pure water, that mix ratio was 20:100 by mass. And the SDBS was dissolved completely Then the test sample was prepared by adding the aridity particle into the SOBS fluid, that mix ratio was 0.9:100 by mass. And the resultant fluid was subjected to an ultrasonic treatment beyond 1 hour.

UT-205S, which manufactured by Sharp Corporation, was used for ultrasonic treatment for preparing sample by 100% output power.

LS-230, which manufactured by Beckman Coulter Inc, was used for measuring of test samples.

An ideal average particle size measured by Coulter method of this invention is 5 μm or less.

If the average particle size measured by Coulter method is over 5 μm, this means the redispersibility is bad which is not desirable.

The average particle size measured by Coulter method of this invention is preferably 3 μm or less, and more preferably 2 μm or less.

Usually, the average particle size measured by Coulter method in this invention is about 0.1 to 2 μm. However, this average particle size decreases by extending dispersion treatment time.

Therefore, for the nano powder of this invention, the dispersion particle size can be controlled on the redispersibility treatment conditions.

When actually forming a paste, the condition of dispersion is stronger than that of measurement of Coulter method, so an even smaller value can probably be obtained.

Furthermore, for one of the index for redispersibility measurement of the composition of dried fine particles, a method which measures the particle mass vestige when filtering the dispersion is commonly used.

This is called a "fluid flow test".

In the present invention, redispersibility was examined of the dispersions, which was prepared for measurement average particle size. The dispersion passes through filter-paper having a retaining particle size of 1 µm, and the weight of particles on the filter was measured for the redispersibility evaluation. The redispersibility can be represented as ("The weight of remained particle on the filter paper after filtration test"/"The weight of particle into the dispersion before filtration test").

In the present invention, the ratio of survival on the filter paper is preferably less than 10 mass %, more preferably less than 5 mass %, and still more preferably less than 1 mass %.

If this value is 10 mass % or more, it means that redispersibility is poor. No. 5C Filter Paper (φ 90 mm) which having a retaining particle size of 1 µm manufactured by Advantec, was used for the present invention. The filtration was carried out by suction filtration using of "BOchner funnel".

If the amount of fluid used in the fluid flow test is too much, collection resulting from clogging of the filter paper is likely to occur. Therefore, the amount of fluid to be used is preferably 150 cm$^3$ or less.

Next, the preservation stability will be described.

The fine silver particles are usually used in a dispersion state dispersed in a solvent.

Thus, in practical view, the pot life in the dispersion state is important.

In the present invention, difference of viscosity before and after preservation was used for an index of pot life evaluation.

The particle of present invention is agglomerated in dry condition. Thus redispersion of this agglomeration needs to do coping of dispersion.

In this case, the viscosity increases along with separation of the agglomerated particles by the dispersion treatment.

By increase of contact area for disentangling of agglomeration; caused to decrease of free solvent, which caused this phenomenon. But by the variation with time, the particle was agglomerated again, that caused to increase of free solvent, so the dispersion viscosity decrease.

Thus, changes of dispersion viscosity can be used as a pot life evaluation index.

In the case of no difference of viscosity before and after preservation in this invention, it can interpret that there is no deterioration dispersibility by preservation. On the other hand, in the case of confirming the difference of viscosity before and after preservation, it can interpret that there is deterioration of dispersibility by preservation.

In the method for producing silver particle, and producing method for composition comprising of such silver particles, it is preferred to use a reaction vessel having a shape and configuration in which uniform stirring can be obtained.

This is because, while the fine silver particles are obtained by a reduction reaction, the size of the particles to be obtained is very small, which means that localized concentration and pH distribution have a large influence on particle size distribution.

So, using of one concrete example of the producing method of silver particle of this invention, each of the production steps will be described along the flow of the reaction <Fluid Preparation Step>

In this step, two kinds of fluid are prepared.

One of the fluids is called "Fluid I" (hereinafter referred to as "reduction fluid"), in which a reducing substance is dissolved. The other fluid is called "Fluid II" (hereinafter referred to as "raw material fluid"), in which the raw material metal salt (especially silver salt) is dissolved.

The reduction fluid was prepared by dissolving following materials into pure-water uniformly; the dissolving material was above-described reducing agent, protection agent, ammonia water acting as a stabilizing agent The raw material fluid is obtained by dissolving crystals of the metal salt in pure water.

<Temperature Increasing Step>

After both the fluids have been prepared, the temperature of the fluids was boosted to the reaction temperature by using a water bath or a heater.

It is preferred to heat up in a similar manner both the reduction fluid and the raw material fluid; this has the advantage of preventing the reaction from being non-uniform during the reaction. In addition, this can be achieving the uniformity of the particles.

At this point, the target temperature (hereinafter referred to as "reaction temperature") of heating is in the range of 40 to 80° C.

<Silver Reaction Step>

At the time the temperature of both fluids has been attained to the target temperature, the raw material fluid is added to the reduction fluid.

From the view of reaction uniformity, it is preferred to add at a burst, while taking account to the no-bumping.

<Aging Step>

The stirring, after the mixing of the reaction fluids, had been continued for about 10 to 30 minutes until completing the growth of the particles.

The confirmation of end-point of reaction practiced as follows; sampling liquid from the reaction fluid, and dropping hydrazine into the sampling fluid, and confirming whether a reaction of unreduced silver occurs.

<FiltrationNVashing Step>

The obtained slurry can separate to solid and fluid by a filtration method.

As the filtration apparatus, a conventional apparatus can be appropriately employed.

"Büchner funnel" spread with filter paper can be used for a small-scale reaction of a few liters.

The kind of filter paper that can be used at this point is not especially limited. Even filter paper having a retaining particle size of several microns can be used.

For a large-scale reaction of tens of liters or more, a filter press can be used.

The washing step is carried out by adding pure water to a cake obtained from the filtration step, and then again filtering that pure water (the state of slurry).

Furthermore, the obtained slurry can be separated to solid and fluid on forcibly sinking particles by using a centrifugal separator.

In this case, the centrifugal separation is carried out by operating at 3,000 rpm for 30 minutes.

After the solid/fluid separation, do away with the supernatant liquid, and pure water is added, and the fluid is dispersed for 10 minutes by an ultrasonic disperser.

The washing step as has been above-mentioned for removing superfluous organic substances adhering to the particles is carried out three times; the step of centrifugal separation, the step of doing away with the supernatant liquid, the step of adding of pure water, and the step of dispersion by ultrasonic.

<Drying Step>

A dried metallic lump was obtained, by drying-step of 12 hours at 60° C., from metal lump (silver lump) made by former steps,

EXAMPLES

The examples will be explained in detail as follows.

Working Example 1

A one liter beaker was used for a reaction vessel.

The stir stick that equipped the stir slats was placed on the center of the reaction vessel.

A thermometer for monitoring the temperature was placed in the reaction vessel.

In addition, a nozzle was constituted so as to supply nitrogen into the fluid from the underneath.

First, 273 g of water was charged into the reaction vessel, and nitrogen was supplied from the underneath of the reaction vessel between 600 seconds 500 mL/min (flow rate) for dissolved oxygen removing.

Nitrogen was then supplied at a flow rate of 500 mL/min from an upper portion of the reaction vessel to form a nitrogen atmosphere in the reaction vessel.

The rotation speed of the stir stick was adjusted from 280 to 320 rpm.

Then, the fluid temperature of the reaction vessel was controlled for 60° C.

7.5 g of ammonia water (the containing of ammonia is 30 mass %) was added into the reaction vessel, and the fluid was stirred for 1 minute to form the homogeneous system.

7.5 g of hexanoic acid as a protection agent (guaranteed reagent, manufactured by Wako Pure Chemical Industries Ltd.) (The weight is corresponding to 2.01 equivalents of the silver) was added into the reaction vessel. And the fluid was stirred 10 minutes for dissolving the protection agent.

A different reagent each for working examples and comparative examples was used as the protection agent.

Then, 20.9 g of hydrazine hydrate (the containing of hydrazine is 50 mass %, manufactured by Otsuka Chemical Co., Ltd) was added into the reaction vessel as reduction fluid.

Here, "equivalents of the silver" in this description mean equal to the molar ratio of silver versus the hexanoic acid. So the "2.01 equivalents" indicate that the hexanoic acid/silver molar ratio is 2.01.

In another vessel, 36 g of silver nitrate crystal was dissolved in 175 g of water (guaranteed reagent, manufactured by Wako Pure Chemical Industries Ltd.), liquid called as "raw material fluid". And this liquid temperature was controlled for 60° C.

Then, the reduction reaction was caused from the act that "raw material fluid" added into "reduction fluid" at a burst.

The stirring was continued while maturing for 10 minutes.

Then, the stirring was stopped, and the fluid underwent a filtration/washing step and a drying step for obtaining a lump of fine silver particles.

Figure 4:
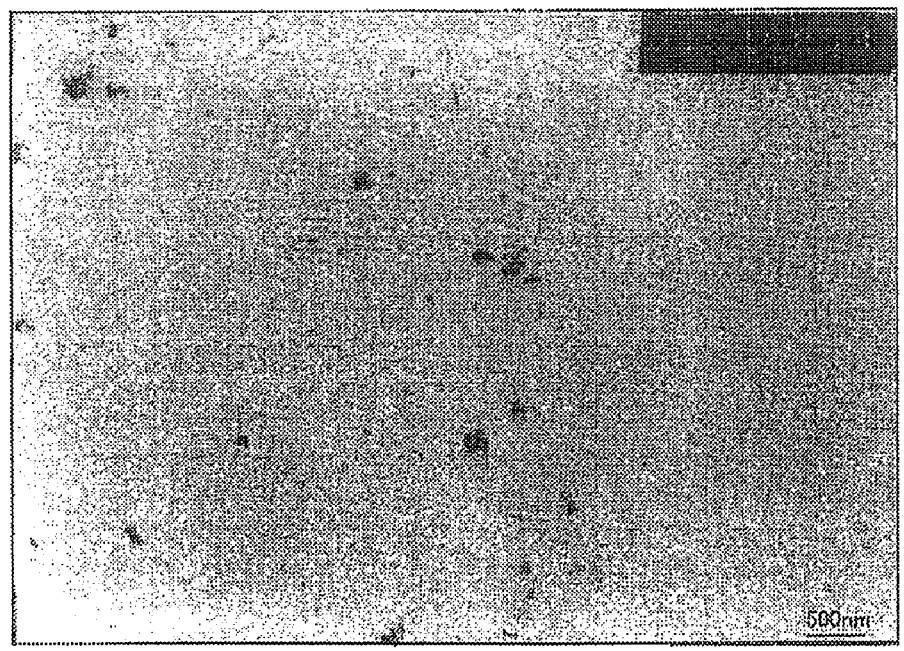
FIG. 4 shows TEM photographs of an example according to the present invention.
Figure 4:
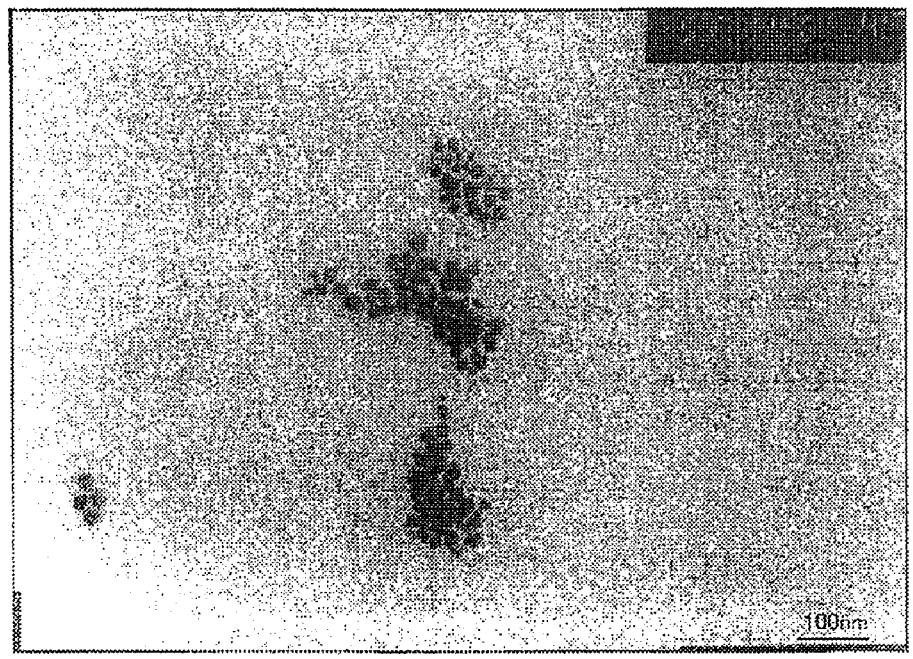
Figure 5:
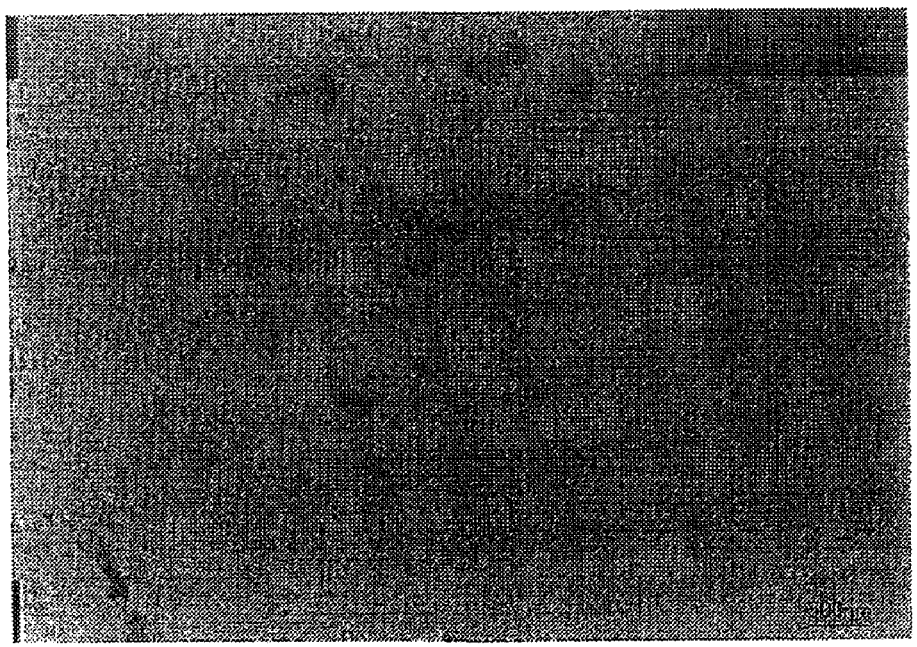
FIG. 5 shows TEM photographs of a comparative example in which heptanoic acid was used as a protection agent.
Figure 5:
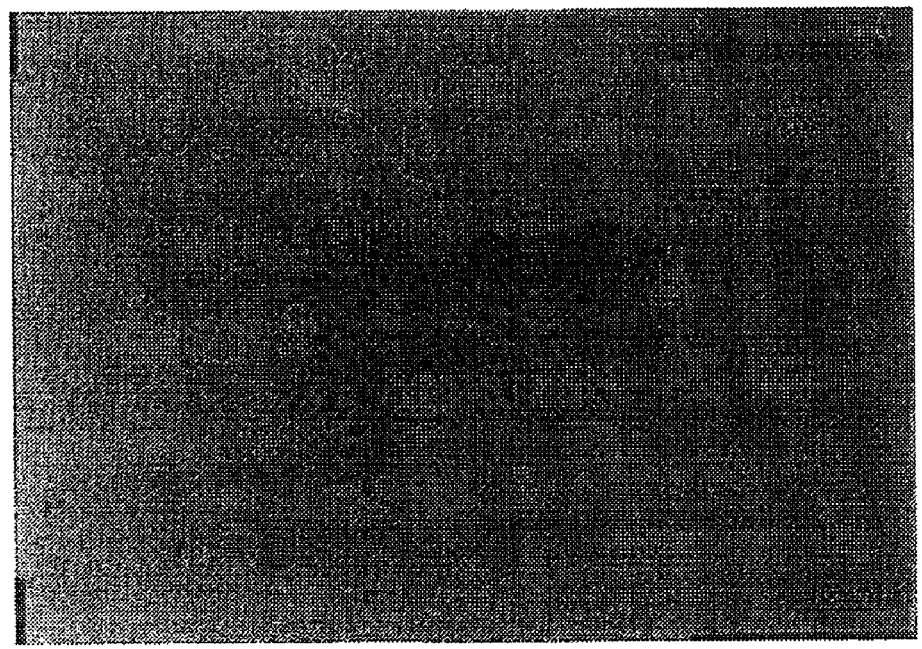
Figure 6:
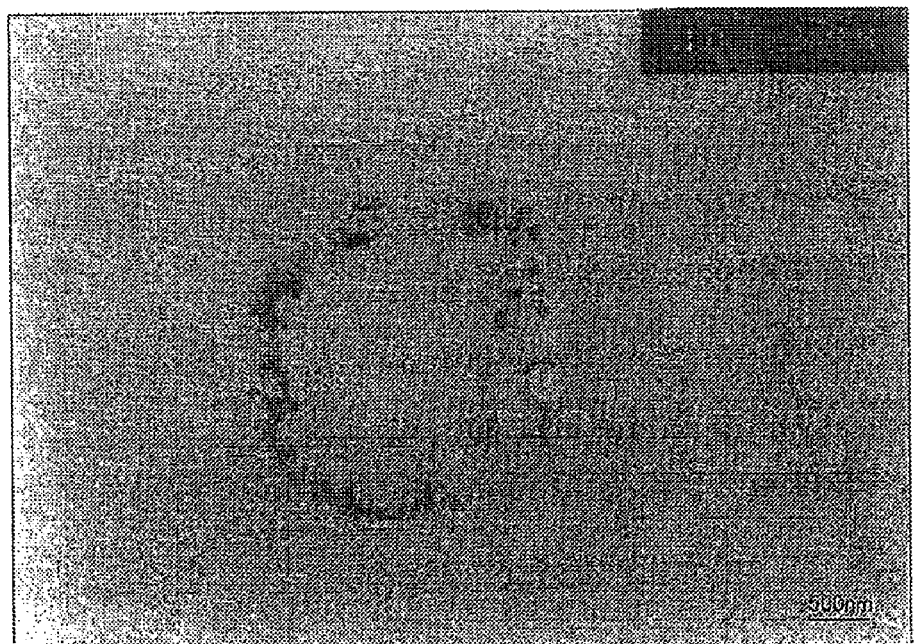
FIG. 6 shows TEM photographs of Comparative Example 2.
Figure 6:
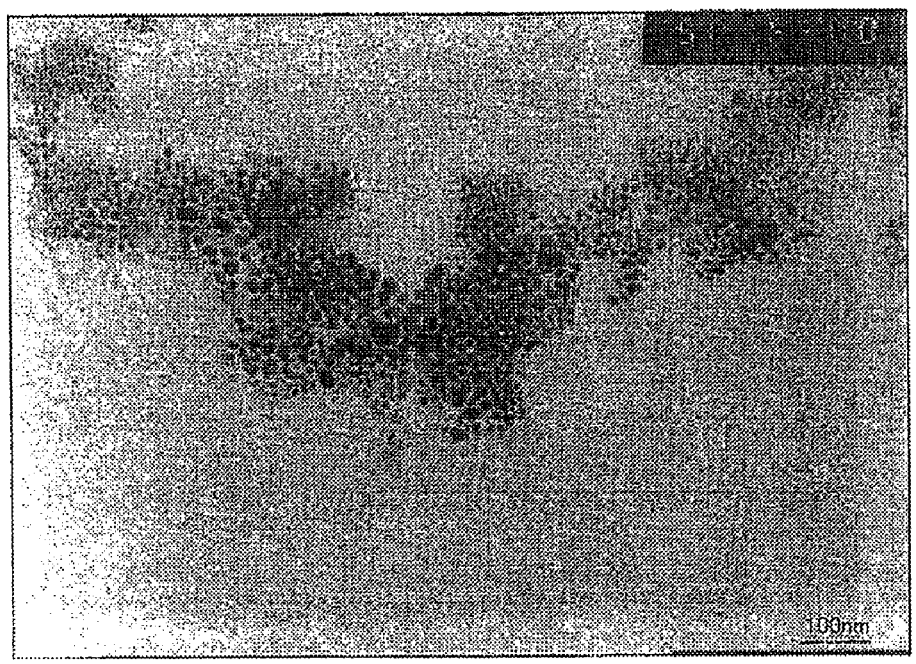
Figure 7:
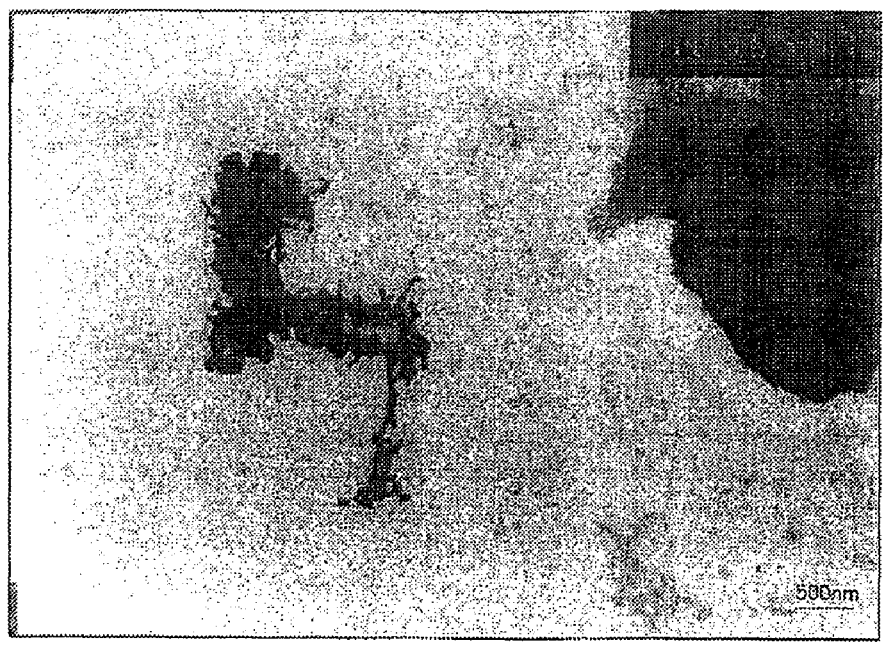
FIG. 7 shows TEM photographs of a comparative example in which a protection agent is not used.
Figure 7:
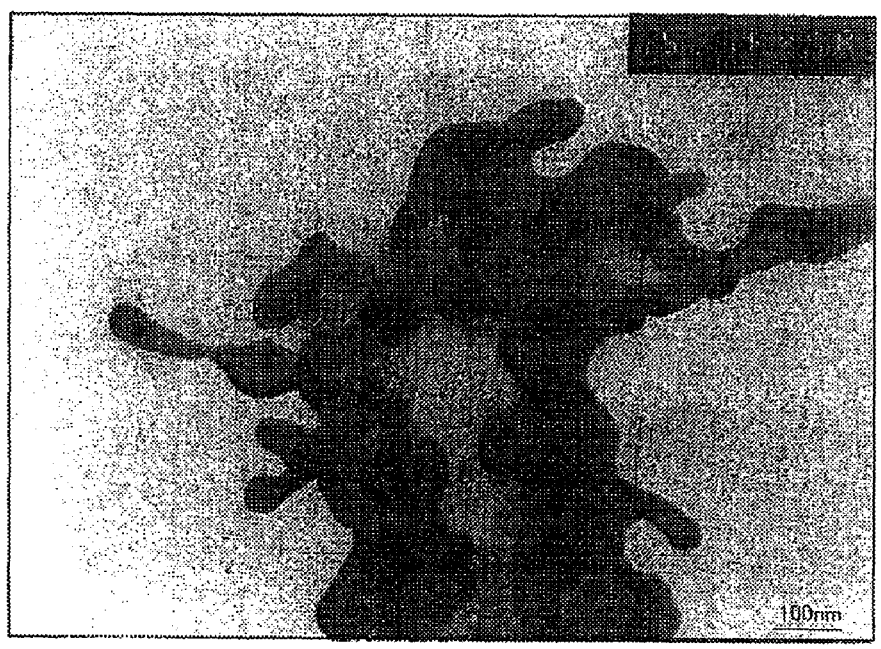

When particles obtained at the stage where the washing step was finished were observed by using a TEM, as illustrated in FIG. 4, it was found that particles was attached with the hexanoic acid were obtained. These particles were fine and comparatively uniform size, and an average particle size was 14 nm.

The primary particle average size according to the TEM was determined by measuring the circle equivalent diameter of 300 or more particles present in the field of view at 174,000 times magnification, and then had calculated of the number-average diameter of those particles.

As understood from the SEM image shown in FIG. 1, dried particles were obtained in form of agglomerate. However, it observed that the agglomerate has many very fine particles when studied carefully under high magnification, In addition, "fluid flow test" and "particle size measurement by Coulter method" were executed. In this case, the measurement sample was prepared as follows; 20 g of SDBS and 0.9 g of dry fine silver particles were added into 100 g of pure water, and the mixture was treated by ultrasonic dispersion for 1 hour.

Working Example 2

The reaction of working example 1 was carried out under the same conditions except that the reaction temperature was changed to 50° C.

The BET value in this case was 7.1 $m^2/g$.

Comparative Example 1

Silver particles were synthesized in the same manner as in working example 1, except that the hexanoic-acid was changed to heptanoic-acid having seven carbon atoms.

Furthermore, a dispersion was prepared under the same conditions in working example 1. And "fluid flow test" and "particle size measurement by Coulter method" were executed.

Comparative Example 2

7.5 g of ammonia water (the containing of ammonia is 30 mass %) was added into the reaction vessel, and the fluid was stirred for 1 minute to form the homogeneous system.

7.5 g of hexanoic acid as a protection agent (guaranteed reagent, manufactured by Wako Pure Chemical Industries Ltd.) (The weight is corresponding to 2.01 equivalents of the silver) was added into the reaction vessel. And the fluid was stirred 10 minutes for dissolving the protection agent.

Then, 20.9 g of hydrazine hydrate (the containing of hydrazine is 50 mass %, manufactured by Otsuka Chemical Co., Ltd) was added into the reaction vessel as reduction fluid.

In another vessel, 36 g of silver nitrate crystal was dissolved in 175 g of water (guaranteed reagent, manufactured by Wako Pure Chemical Industries Ltd.), liquid called as "raw material fluid". And this liquid temperature was controlled for 60° C.

Then, a reduction reaction was carried out by gradually adding the raw material fluid to the reduction fluid at an addition rate of 5 mL/min (requiring 35 minutes until the addition was finished) using a tube pump.

The stirring was continued while maturing for 10 minutes.

Then, the stirring was stopped, and the fluid underwent a filtration/washing step and a drying step for obtaining a lump of fine silver particles.

Comparative Example 3

Silver particles were produced in the same manner as working example 1, except that heptanoic acid was not added.

Next, to confirm the pot life of the composition containing fine silver particles of this invention, working examples 20 to 23 were carried out as follows.

Working Example 20

Terpineol was added to the fine silver particles of this invention until the concentration of silver was 60 mass %, and dispersed to obtain the paste.

The dispersion was carried out by manually stirring, and then mechanical dispersion treatment was executed by "Awatori-Rentaro AR-250" manufactured by Thinky Corporation by a mixing mode for 1 minute, and more dispersion treatment was executed by a triple roll mill.

This paste was placed in an incubator at 25° C. Redispersion was executed, in that day and after keeping in incubator on the 7 days and 13 days. And the viscosity of these paste were measured by rheometor. The dispersion treatment was executed by "Awatori-Rentaro AR-250" by a mixing mode for 1 minute, and more dispersion treatment was carried out by manually stirring, and more mechanical dispersion treatment was executed by "Awatori-Rentaro AR-250" by a mixing mode for 1 minute.

Working Example 21

The process of working example 20 was carried out under the same conditions except that the solvent was changed to 2-phenoxy-1-propanol (hereinafter referred to as "Downol").

Working Example 22

The process of working example 20 was carried out under the same conditions except that the solvent was changed to Texanol.

Working Example 23

The process of working example 20 was carried out under the same conditions except that the solvent was changed to butyl carbitol acetate (hereinafter referred to as "BCA").

In Working Examples 30 to 34 inquired into the influence for pot life from the dispersion agent.

Working Example 30

The process of working example 20 was carried out under the same conditions except that 5 mass % of Disper BYK 2001 (manufactured by BYK Japan KK) with respect to silver was used as the dispersion agent.

Working Example 31

The process of working example 30 was carried out under the same conditions except that the solvent was changed to Downol.

Working Example 32

The process of working example 30 was carried out under the same conditions except that the solvent was changed to Texanol.

Working Example 33

The process of working example 30 was carried out under the same conditions except that the solvent was changed to BCA.

Working Example 34

The process of working example 30 was carried out under the same conditions except that the solvent was changed to γ-butyrolactone.

The experiment conditions are shown in Table 1.
The results of the Coulter size measurement and the fluid flow test carried out in Working Example 1 and Comparative Example 1 are shown in Table 2.
Furthermore, the results on Working Examples 20 to 34 are shown in Table 3 and FIGS. 8 and 9.

TABLE 1

| | Raw Material | | | | |
|---|---|---|---|---|---|
| | Organic Protection Agent | Ag Added Amount | Protection Agent Equivalents with respect to Ag | Addition Method Into Reduction Solution | Reaction Temperature |
| Example 1 | Hexanoic acid | 0.05 mol/L | 2.01 eq | All at once | 60° C. |
| Example 2 | Hexanoic acid | 0.05 mol/L | 2.01 eq | All at once | 50° C. |
| Comparative Example 1 | Heptanoic acid | 0.05 mol/L | 2.01 eq | All at once | 60° C. |
| Comparative Example 2 | Heptanoic acid | 0.05 mol/L | 2.01 eq | Continuous addition | 60° C. |
| Comparative Example 3 | None | 0.05 mol/L | — | All at once | 60° C. |

Figure 2:
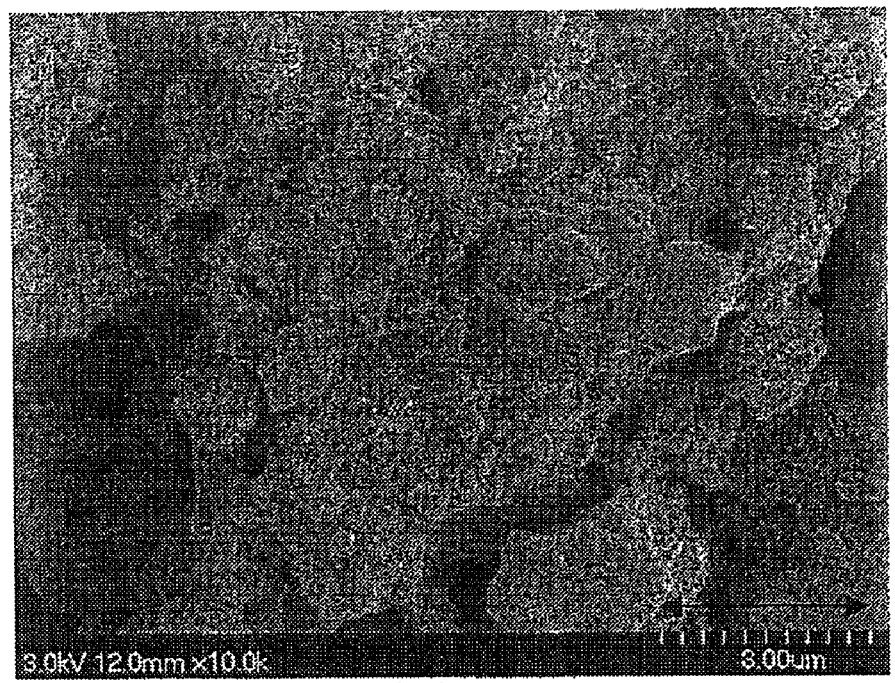
FIG. 2 shows SEM photographs of Comparative Example 2.
Figure 2:
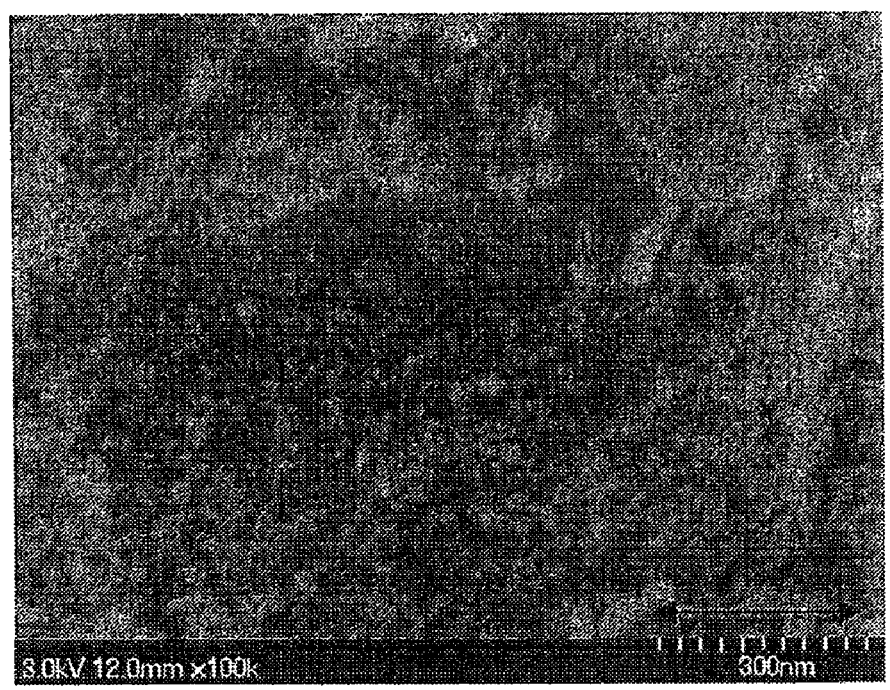
Figure 3:
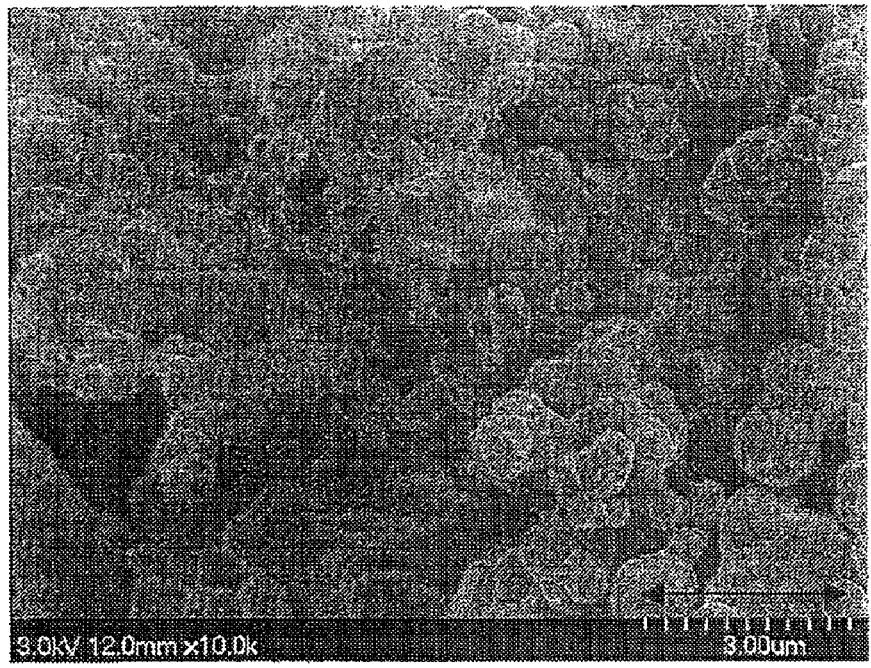
FIG. 3 shows SEM photographs of a comparative example in which a protection agent is not used.
Figure 3:

FIGS. 1 to 3 show photographs of each sample taken by a scanning electron microscope (FE-SEM). FIGS. 4 to 7 show photographs of each sample taken by a transmission electron microscope (TEM).

FIG. 1(a) is at a magnification of 10,000 times, and FIG. 1(b) is at a magnification of 100,000 times.

The double-headed arrows in the photographs represent 3.0 μm for FIG. 1(a) and 300 nm for FIG. 1(b).

This is the same for all of FIGS. 1 to 3.

In Example 1 (FIG. 1), it can be observed under SEM observation at 10,000 times magnification that fine particles with a comparatively uniform size were gathered together. Even under observation at 100,000 times magnification, the particle size seemed very uniform, and the particles are each produced in an isolated shape. In contrast, it can be seen that for the particles of Comparative Example 2 (FIG. 2), particles agglomeration or particle sintering has frequently occurred, and that the uniformity of the particle size is not obtained.

At the particles of Comparative Example 3 (FIG. 3) which were formed without adding the protection agent, the particles themselves looked as though they have been sintered. Furthermore, it can be seen that the confirmed primary particles are both large and irregular.

FIG. 4 is TEM photograph of particle state obtained from Working Example 1.

FIG. 4(a) is at 30,000 times magnification, and FIG. 4(b) is at 174,000 times magnification. A 500 nm reference line was put in the photograph of FIG. 4(a), and a 100 nm reference line in FIG. 4(b).

It can be perceived that at 30,000 times magnification photograph, rough particles formed by sintering are not present.

On the other hand, particles formed agglomeration which seems lumps when observed at 30,000 times magnification. And in the observation at 174,000 times magnification, these particles which formed agglomeration were separate and independent.

Furthermore, it can be perceived that spherical particles having a comparatively uniform particle size were obtained.

On the other hand, in Comparative Example 1 (FIG. 5), similar to the working examples, it was confirmed that the particles were agglomerated to each other, and that the individual particles were independent.

However, when each particle was confirmed, it can be perceived that the particle size was not uniform, and the particle shape was also non-uniform.

It can be also said in Comparative Example 2 (FIG. 6), where it can be perceived that the particle size dispersion was more conspicuous. In the Example, particle had a wide size region of from several nanometers to tens of nanometers.

In Comparative Example 3 (FIG. 7), it is perceived to generate the particle that forms the infinite form and enormous size by sintering. Consequently, it can be understood that the presence of the protection agent is necessary for securing the independence of the particles.

The above results suggest that fine particles of 100 nm or less cannot be produced unless a protection agent is in existence regardless of heptanoic-acid or hexanoic-acid.

That is to say, the above-results suggest that without the existence of a protection agent, the growth of silver and the sintering of each particle due to additional reduction reactions after the particles which will serve as the core are formed in the reaction vessel cannot be stopped. And the results suggest that the lack of the protection agent caused disorderly growth and developing.

In other words, if the reduction reaction of silver is executed under the existence of the protection agent, it can be said that the protection agent is adhere or bonding with surface of the reaction product particle.

Next of view, by comparing of working example 1 and Comparative Example 2, it can be perceived that Comparative Example 2 has more amounts of small size particles.

It can guess to be a lot of small particles at high probability, not only from the TEM photograph at 174,000 times magnification, but also from the SEM photograph at 10,000 times magnification which seemed to be an indeterminate shape.

Namely, in the SEM photograph 10,000 times magnification, silver particles having a few nm diameters can not observe by each independent particle but as continuous matter.

It is thought that the protection agent have an effect to inhibit about silver growth at the surface of the silver particle when the reduction reaction has occurred by injecting of the "raw material fluid" into the reaction vessel. Thus, the difference between hexanoic acid and heptanoic acid can be considered to be an important factor in determining whether particles having a uniform particle shape and particle size distribution can be produced.

More specifically, the results show that heptanoic acid was insufficient to form particles having a uniform particle shape. Furthermore, why large particles were also formed when heptanoic acid was continuously added can be thought to be as follows. Namely, because the heptanoic acid acting as the protection agent was consumed in the initial reaction stage, there was not enough heptanoic acid to protect against reactions towards the end of the addition of the aqueous silver nitrate fluid.

Therefore, it was learned that to obtain a comparatively uniform particle size, it is preferred to add the fluid at a burst Thus, in addition to using hexanoic acid as the protection agent, it is thought that the addition at a dash of the silver nitrate aqueous fluid contribute in part for obtaining uniformly fine silver particle at level of several tens of nm.

Next, at referring of Table 2, from the result of working example 1 the fine silver particle and composition was obtained by using hexanoic acid, has small Coulter average size (0.201 μm), and has small collection efficiency of the particle on the filter paper. It means that the particle was the agglomeration on the state of drying. But, once the particles are added into the solvent, can redisperse.

TABLE 2

|  | Organic Protection Agent | Coulter Size (Average) (μm) | Liquid Passing Test (%) |
| --- | --- | --- | --- |
| Example 1 | Hexanoic acid | 0.201 | 0.23 |
| Comparative Example 1 | Heptanoic acid | 9.34 | 66.6 |

In contrast, the fine silver particle in comparative Example 1 the fine silver particle and composition was obtained by using heptanoic acid, has a very large Coulter average size, and has large collection efficiency (66.6 mass %) of the particle on the filter paper.

Consequently, it is suggested that when hexanoic acid is used for the protection agent, the redispersibility of particles of drying state when adding into the solvent is markedly improved.

Figure 8:
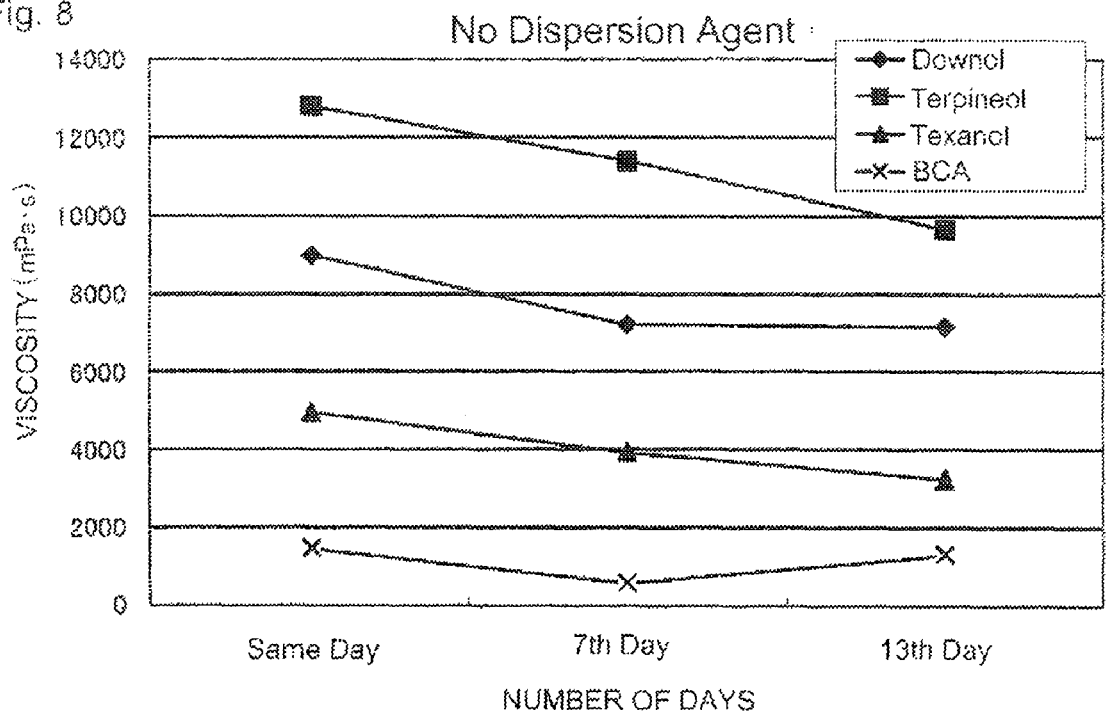
FIG. 8 is a graph showing the relationship between the solvent and dispersibility.

Next, at referring of Table 3 and FIG. 8.

The viscosity described in Table 3 is a value measured using the RheoStress RS600 (Haake). The condition at the measurement is the shear rate dy/dt (1/s) was 3.038 at 25° C.

If the fine silver particle is dispersed, the increase of viscosity occurred by the degree of the dispersion, by lacking of the free solvent caused by increasing the contact area with the solvent by the large amount of surface area.

Namely, the degree of viscosity is able to use for index of redispersibility.

TABLE 3

|  | Solvent | Dispersion Agent | Viscosity | | | | |
| --- | --- | --- | --- | --- | --- | --- | --- |
|  |  |  | Same Day | 7th Day | 13th Day | 14th Day | 21st day |
| Example 20 | Terpineol | No | 12800 | 11400 | 9660 | — | — |
| Example 21 | Downol | No | 9000 | 7220 | 7170 | — | — |
| Example 22 | Texanol | No | 4960 | 3950 | 3240 | — | — |
| Example 23 | BCA | No | 1460 | 577 | 1320 | — | — |
| Example 30 | Terpineol | Yes | 36900 | 21900 | — | 25900 | 24200 |
| Example 31 | Downol | Yes | 64300 | 67400 | — | 80000 | 79900 |
| Example 32 | Texanol | Yes | 20300 | 14200 | — | 13700 | 14400 |

TABLE 3-continued

| | Solvent | Dispersion Agent | Viscosity | | | | |
|---|---|---|---|---|---|---|---|
| | | | Same Day | 7th Day | 13th Day | 14th Day | 21st day |
| Example 33 | BCA | Yes | 12200 | 9340 | — | 12300 | 10600 |
| Example 34 | γ-Butyrolactone | Yes | 12000 | 1890 | — | 3880 | — |

FIG. 8 is plotted the value of viscosity by Working Examples 20 to 23 extracted from Table 3. The horizontal axis represents the number of preservation days, and the vertical axis represents the viscosity.

As described above, a high viscosity means that dispersibility is high.

In all of the examples, viscosity tended to decrease over time, and dispersibility tended to deteriorate.

However, Downol and terpineol have a high viscosity originally, so that dispersibility can be considered to be high.

Next, the effect of the dispersion agent in the paste will be described.

In practically, the pot life of the paste is an important feature.

Therefore, Examples 30 to 34 were produced by adding a solvent and a dispersion agent to the composition containing fine silver particles of the present invention.

Figure 9:
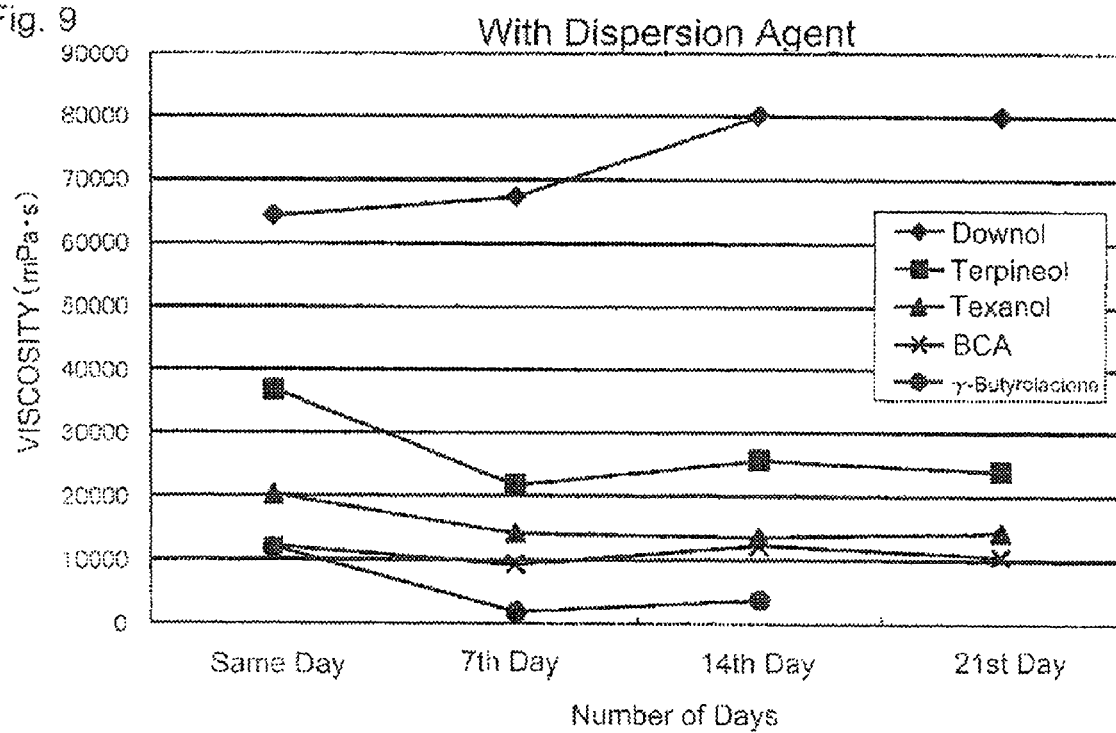
FIG. 9 is a graph showing the relationship between pot life and viscosity.

FIG. 9 shows the value of viscosity by Working Examples 30 to 34 extracted from Table 3.

Due to the effect of the dispersion agent, all of the examples showed a higher viscosity from the initial viscosity than for when a dispersion agent was not used.

Consequently, the effect of adding a dispersion agent into the paste was recognizable.

Furthermore, for all of Examples 30 to 34, the value of viscosity after 7 days was a constant. Thus, it was appreciated that including a dispersion agent in the paste improves the pot life.

INDUSTRIAL APPLICABILITY

According to the present invention, a composition containing fine silver particles having excellent redispersibility for a solvent, and a dispersion using that composition containing fine silver particles, can be obtained. Consequently, the present invention can be preferably utilized in various applications using such composition or dispersion containing fine silver particles.

For example, the present invention can be utilized in various applications, such as electrode formation for "FPD/solar cells/organic EL", "RFID wire formation", "a fine trench", "wires which are embedded in via hole contact hole or the like", "a colorant for automobile or ship coatings", "a carrier on which is adsorbed a biochemical substance for the medical, diagnostic, or biotechnology fields", "an antimicrobial coating utilizing an antimicrobial effect", "a catalyst", "a conductive adhesive", "a conductive paste formed by mixing with a resin or a flexible printed circuit board using such a conductive paste", "a high-flexibility shield", "a capacitor" and the like.

According to the present invention, a composition in which fine silver particles are uniformly monodispersed in a polar solvent can be obtained. Therefore, the present invention can be utilized in applications (for example, a reflective film) in which it is thought that effects can be obtained due to a uniform particle size.

What is claimed is:

1. A paste including a composition containing fine silver particles, the fine silver particles being bonded to a linear fatty acid having six or less carbon atoms, wherein a primary particle average size measured from TEM observation is in a range of 1 to 100 nm the fine silver particles having a specific surface area measured by BET of 7-20 m$^2$/g, and the fine silver particles being produced in a polar solvent.

2. The paste having fine silver particles as claimed in claim 1, wherein the linear fatty acid is hexanoic acid.

3. The paste having fine silver particles as claimed in claim 1, wherein the composition is dispersed in a polar solvent.

4. The paste having fine silver particles as claimed in claim 2, wherein the composition is dispersed in a polar solvent.

5. The paste having fine silver particles as claimed in claim 1, wherein the fine silver particles have a specific surface area measured by BET of 10-20 m$^2$/g.

* * * * *